(12) United States Patent
Boos

(10) Patent No.: US 7,599,669 B2
(45) Date of Patent: Oct. 6, 2009

(54) TRANSMITTING ARRANGEMENT, TRANSRECEIVER WITH A TRANSMITTING ARRANGEMENT AND METHOD FOR SIGNAL PROCESSING

(75) Inventor: Zdravko Boos, München (DE)

(73) Assignee: Infineon Technologies AG, Munich (DE)

( * ) Notice: Subject to any disclaimer, the term of this patent is extended or adjusted under 35 U.S.C. 154(b) by 634 days.

(21) Appl. No.: 11/482,559

(22) Filed: Jul. 7, 2006

(65) Prior Publication Data

US 2007/0021078 A1    Jan. 25, 2007

(30) Foreign Application Priority Data

Jul. 8, 2005    (DE) .................... 10 2005 032 060

(51) Int. Cl.
  *H04B 1/04* (2006.01)
  *H01Q 11/12* (2006.01)
(52) U.S. Cl. .................. 455/114.3; 455/126; 455/114.2
(58) Field of Classification Search .................. 455/91, 455/114.2, 114.3, 115.1, 127.2, 127.3, 102; 375/295, 296, 298, 300
  See application file for complete search history.

(56) References Cited

U.S. PATENT DOCUMENTS

| | | | |
|---|---|---|---|
| 6,366,177 B1 | 4/2002 | McCune et al. | |
| 6,373,902 B1* | 4/2002 | Park et al. | 375/296 |
| 7,120,396 B2 | 10/2006 | Wilson | |
| 7,346,122 B1* | 3/2008 | Cao | 375/296 |
| 7,421,037 B2* | 9/2008 | Shakeshaft et al. | 375/295 |
| 7,424,064 B2* | 9/2008 | Shakeshaft et al. | 375/295 |
| 7,466,965 B2* | 12/2008 | Tanabe | 455/102 |

FOREIGN PATENT DOCUMENTS

| | | |
|---|---|---|
| DE | 100 29 117 A1 | 2/2001 |
| JP | 2004-356835 A | 12/2004 |
| JP | 2005-064662 A | 3/2005 |
| JP | 2005-064663 A | 3/2005 |
| WO | WO 01-08319 | 2/2001 |
| WO | WO 01/65682 A2 | 9/2001 |
| WO | WO 01/65684 A1 | 9/2001 |

* cited by examiner

*Primary Examiner*—Sonny Trinh
(74) *Attorney, Agent, or Firm*—Eschweiler & Associates, LLC

(57) ABSTRACT

A transmitting arrangement includes a first signal input for supplying a frequency modulation signal, a second signal input for supplying an amplitude modulation signal, a phase-locked loop and an amplifying device. The latter is connected with a control connection to the second signal input. A signal input of the amplifying device is connected to the output of the phase-locked loop. A conversion device with a local-oscillator input is provided in a feedback path. The conversion device is constructed for splitting a signal, coupled out from an output of the amplifying device, into a first component and a second component with the aid of a local-oscillator signal. In this arrangement, the local-oscillator input is coupled to the output of the phase-locked loop.

19 Claims, 3 Drawing Sheets

TRANSMITTING ARRANGEMENT, TRANSRECEIVER WITH A TRANSMITTING ARRANGEMENT AND METHOD FOR SIGNAL PROCESSING

REFERENCE TO RELATED APPLICATIONS

This application claims the benefit of the priority date of German application DE 10 2005 032 060.0, filed on Jul. 8, 2005, the contents of which are herein incorporated by reference in their entirety.

FIELD OF THE INVENTION

The invention relates to a transmitting arrangement and to a transreceiver with the transmitting arrangement. The invention also relates to a method for signal processing.

BACKGROUND OF THE INVENTION

Among other things, modern transceivers use polar transmitters for their transmitting path. In this concept, the data to be transmitted are split into their phase and amplitude components, respectively. Amplitude and phase components are very frequently provided as digital signals. The phase component, the so-called phase modulation word, is used for driving a phase-locked loop which generates a frequency- or phase-modulated carrier signal. This is supplied to a power amplifier. The gain of the power amplifier is changed as a function of the amplitude component, the amplitude modulation word. This results in a frequency or phase modulation with simultaneous amplitude modulation of the carrier signal.

In order to ensure data transmission which is as free of errors as possible, it is necessary that the output signal of the transmitting path reproduces the input signal as linearly as possible. In the actual implementation, however, power amplifiers which have a non-linear transfer characteristic are frequently used for reasons of power consumption. Prior art FIGS. 6A and 6B show a so-called amplitude/amplitude distortion (AM/AM) or amplitude/phase distortion (AM/PM), respectively, of a typical power amplifier. Thus, FIG. 6A shows that the output amplitude AAM of a power amplifier is dependent on the input amplitude EAM of a signal into the power amplifier. Similarly the output phase PM of the amplified signal delivered by the power amplifier also changes based on the input amplitude AM of the signal as shown in FIG. 6B.

To correct these distortions called AM/AM or AM/PM distortion, respectively, predistortion units are provided in the transmit paths of modern communication devices. There, coefficients are selected based on the input amplitude, and are used to predistort the input signal so that a possibly ideal amplified signal is produced at the output of the power amplifier.

Depending on the parameters to be taken into consideration, however, the number of predistortion coefficients to be used is very large. This results in large memory consumption and elaborate calibration measures during the production.

Another possibility, therefore, consists in feeding back the signal delivered by the amplifier and determining the distortion caused by the individual elements of the transmit path. This then allows the predistortion coefficients to be determined. FIG. 5 shows such a prior art embodiment of a polar transmitter in a transmit path. In this arrangement, the carrier signal, amplitude-modulated by the power amplifier 2, is delivered at its output 22 and radiated via the antenna 5. A part of the output signal is coupled out by a directional coupler 31 and supplied to a feedback path 3a. This can be formed, for example, by the received path of a transceiver. In the feedback path, demodulation occurs and conversion into the in-phase component I' and the quadrature component Q' is performed. During this process, the local-oscillator signal used for the reception of signals is used as shown.

SUMMARY OF THE INVENTION

The following presents a simplified summary in order to provide a basic understanding of one or more aspects of the invention. This summary is not an extensive overview of the invention, and is neither intended to identify key or critical elements of the invention, nor to delineate the scope thereof. Rather, the primary purpose of the summary is to present one or more concepts of the invention in a simplified form as a prelude to the more detailed description that is presented later.

The present invention is directed to a transmitting arrangement wherein distortions in the output signal are determined in a simple manner. Similarly, a transceiver is provided in which the expenditure for the delivery of a linear amplified signal is as little as possible. The invention also comprises a method for signal processing which allows distortions in a transmission signal to be determined in a simple manner.

According to one embodiment of the invention, a transmitting arrangement comprises a first signal input configured to receive a frequency modulation word, a second signal input configured to receive an amplitude modulation word, and a phase-locked loop with an output and a correcting input. The correcting input is coupled to the first signal input. The output of the phase-locked loop is connected to an amplifying device which has a control connection coupled to the second signal input. Furthermore, a feedback path is provided which is connected to the amplifier output for feeding back a portion of a signal delivered by the amplifying device. The feedback path comprises, in one embodiment, a conversion device with a local-oscillator input. The conversion device is configured to split a signal present at its input into a first component and a second component with the aid of a local-oscillator signal at the local-oscillator input. In one embodiment of the invention, the local-oscillator input of the conversion device is coupled to the output of the phase-locked loop.

In another embodiment of the invention, the transmitting arrangement comprises a first signal input, a second signal input and a polar transmitter configured to generate a frequency-modulated signal and an output signal that is amplitude-modulated. The polar transmitter is connected to the first and second signal input of the transmitting arrangement and an output coupling unit is connected to an output of the polar transmitter. The transmitting arrangement also comprises a demodulation device which is connected to the output-coupling unit and is configured to convert a signal supplied into a first and a second component with the aid of the frequency-modulated signal as a local-oscillator signal.

In one embodiment of invention, a conversion device is supplied with a frequency-modulated local-oscillator signal and is used to determine a distortion. This local-oscillator signal is provided by the polar transmitter or, respectively, the phase-locked loop of the polar transmitter. In one embodiment of the invention, the local-oscillator input of the conversion device is coupled to the input of the amplifying device. The amplifying device and the local-oscillator input are thus supplied with the same frequency-modulated signal.

Due to the use of the frequency-modulated signal and thus the input signal of the amplifier, the frequency modulation is taken into consideration and compensated for by the conversion device during the conversion of the feedback signal with the aid of the local-oscillator signal. The converted signal accordingly reflects the direct error and the distortion which is caused by the amplifying device. Thus, an AM/AM or, respectively, AM/PM distortion caused by the power amplifier is demodulated and determined. Using this additional information, further predistortion of the input signal can be performed and thus linearity is maintained in a simple manner.

In one embodiment, the invention allows slow changes, which cannot be expected in advance, in the characteristic of a power amplifier to be determined and to correct it by suitable predistortion. These changes include, among other things, temperature fluctuations, change in the standing wave ratio at the output of the power amplifier, ageing phenomena and changes in the supply voltage of the power amplifier.

In one embodiment of the invention, the transmitting arrangement also comprises a converting device configured to deliver the frequency modulation word and the amplitude modulation word from a first component and a second component. In a development of this embodiment, the converting device is configured to transform the in-phase component and the quadrature component into the amplitude and phase component. In another embodiment of the invention, a directional coupler is provided in the feedback path and configured to couple out the proportion of the signal delivered by the amplifying device. This coupler is coupled to the conversion device, and in one embodiment, is also used to attenuate the output proportion by a certain level. For this purpose, it has an additional attenuating element in one embodiment.

In another embodiment of the invention, a distortion unit is provided that is supplied with the signals to be transmitted at the input. At the output, the distortion device is connected to the first and second signal input of the transmitting arrangement. The distortion unit is configured to distort signals supplied based on adjustable coefficients and deliver these signals at its output.

In one embodiment, the distortion unit contains a memory in which predistortion coefficients are stored. These are selected in dependence on an amplitude of a signal supplied at the input. The predistortion coefficients are designed in such a manner that they at least partially correct at least one nonlinear transfer characteristic of the amplifying device.

In another embodiment of the invention, the distortion unit contains a second control input which is coupled to the conversion device that supplies the demodulated signal. Thus, in the embodiment, the demodulated error signal is supplied to the distortion unit and taken into consideration during the distortion. In one embodiment of the invention, the distortion unit is connected before the converting unit. It is thus used to distort the first and second component and, in one example, the in-phase and quadrature component.

In another embodiment, the distortion unit precedes the correcting input of the phase-locked loop and/or the control connection of the amplifying device. The distortion unit is configured to change the amplitude modulation word or the frequency modulation word, respectively, based on adjustable coefficients.

The conversion device, the output signals of which contain a phase distortion or amplitude distortion, respectively, of the signal delivered by the power amplifier, allow additional corrections to be determined for the amplitude modulation word and the phase modulation word. For this purpose, an additional distortion unit is provided in one embodiment which precedes the correcting input of the phase-locked loop. The distortion unit is supplied with the signal generated by the conversion device or a signal derived therefrom.

The transmitting arrangement according to one embodiment of the invention is employed in a transceiver. For this purpose, a transceiver comprises the transmitting arrangement and a receiving path which is configured to receive and demodulate signals. The receiving path has a conversion device that is coupled to the output of the phase-locked loop of the transmitting arrangement with a local-oscillator input. As a result, the receiving path can also be used for the demodulation of the error signal in a transceiver. For this purpose, the local-oscillator input of a conversion device in the receiving path is coupled to the input of the power amplifier. The local-oscillator input of the conversion device is thus supplied with the frequency-modulated carrier signal as local-oscillator signal.

In yet another embodiment of the invention, a method for signal processing comprises providing a phase modulation signal and an amplitude modulation signal, and generating a phase-modulated carrier signal in response to the phase modulation signal. The phase-modulated carrier signal is then amplified in response to the amplitude modulation signal, and a portion of the amplified carrier signal is coupled therefrom. The portion is then frequency-converted with the aid of a local-oscillator signal derived from the phase-modulated carrier signal.

With this frequency conversion, the frequency modulation is corrected and only the distortions caused by the amplification are taken into consideration. The error signal resulting from the frequency conversion can thus be used for predistortion in a simple manner.

In another embodiment of the invention, the method also comprises the step of generating the predistortion coefficients from the frequency-converted component and correcting the phase-modulation signal or the amplitude-modulation signal with the coefficients generated.

To the accomplishment of the foregoing and related ends, the following description and annexed drawings set forth in detail certain illustrative aspects and implementations of the invention. These are indicative of but a few of the various ways in which one or more aspects of the present invention may be employed. Other aspects, advantages and novel features of the invention will become apparent from the following detailed description of the invention when considered in conjunction with the annexed drawings.

BRIEF DESCRIPTION OF THE DRAWINGS

In the text which follows, the invention will be explained in detail by means of a number of exemplary embodiments. The embodiments shown are in no way restricted. The individual features can be combined with one another arbitrarily. Apart from the polar transmitters shown, polar modulators can also be used. In the figures.

DETAILED DESCRIPTION OF THE INVENTION

Figure 1:
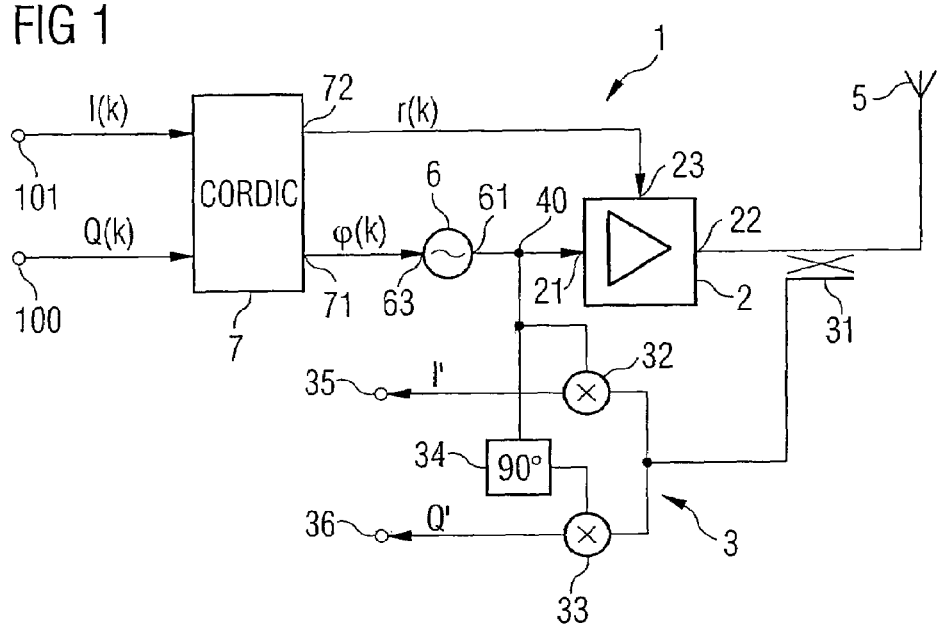
FIG. 1 is a block diagram illustrating a transceiver according to one embodiment of the invention.

FIG. 1 shows a block diagram for illustrating one embodiment of the invention. The transmitting arrangement is implemented in one example as an integrated circuit in a semiconductor body. It has a first input 100 and a second input 101 configured to receive a digital in-phase component I(k) and a digital quadrature component Q(k) of a transmission signal. These are provided by a base band unit, not shown. In this arrangement, the base band unit takes into consideration the type of modulation to be used for the selected mobile communication standard. The binary data to be transmitted are combined to form so-called symbols to which individual I and Q values are allocated. These are supplied to the transmitting arrangement according to the invention as an in-phase component and quadrature component with the symbol clock weight k.

The inputs 100 and 101, respectively, are connected to a converting device 7. This generates a digital phase modulation word φ(k) and an associated digital amplitude modulation word r(k) from the in-phase component I(k) and the quadrature component Q(k). The phase modulation word φ(k) specifies the angle between the x axis on the IQ plane and the symbol to be transmitted.

The output 71 of the converting device 7 for delivering the phase modulation word φ(k) is connected to a correcting input 63 of a phase-locked loop 6. From this, the phase-locked loop 6 generates a frequency- and phase-modulated carrier signal, respectively, and delivers it at its output 61. The output 61 is connected to a signal input 21 of a power amplifier 2. The phase-locked loop 6 and the power amplifier 2 are part of a polar transmitter 1.

The power amplifier 2 also comprises a control input 23. This is connected to the second output 72 for delivering the amplitude modulation word r(k) of the converting device 7. The two outputs 71 and 72 of the converting device 7 at the same time also form the first and second signal input for the polar transmitter 1.

Due to the amplitude modulation word r(k) supplied at the correcting input 23, the power amplifier 2 changes its supply voltage. The resultant modulation of the supply voltage also changes the gain as a result of which the carrier signal supplied at the input end, which is already phase modulated, is modulated in its amplitude. Thus, the supply voltage of the power amplifier 2 is modulated by the amplitude modulation word r(k) supplied and thus an amplitude modulation is applied to the carrier signal. The amplified and amplitude-modulated signal is delivered to the antenna 5 at the output 22 of the power amplifier 2.

Figure 6A:
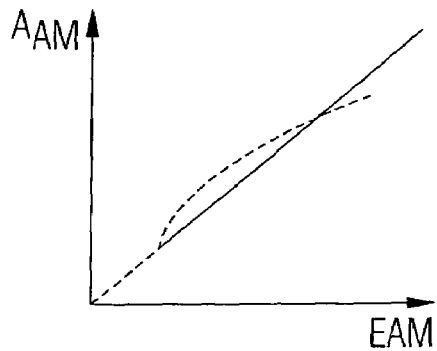
FIGS. 6A and 6B are graphs illustrating the phase and amplitude distortion in the prior art, respectively.
Figure 6B:
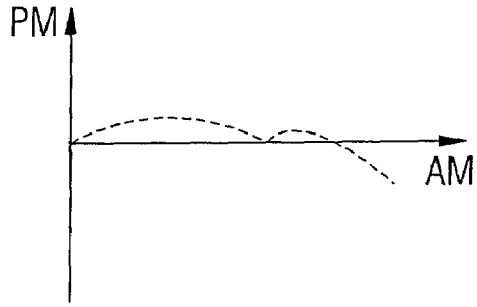

Because of the nonlinear transfer line of the power amplifier 2, the amplitude/amplitude or amplitude/phase distortion represented in FIGS. 6A and 6B can arise. These can be caused, for example, by a change in the standing wave ratio at output 22 of the power amplifier 2. The reason for this can be a change in the spatial environment of the antenna, for example due to additional reflections on metallic surfaces. In addition, the transfer characteristic of the power amplifier 2 can also change due to temperature fluctuations.

The changes listed by way of example above lead to distortions in the output signal and thus to data errors. Since the magnitude or the occurrence of the distortions cannot be unambiguously determined in advance, a feedback path with a conversion device 3 configured to determine the errors resulting from the distortions is provided in the transmitting arrangement according to the invention. The feedback path comprises a directional coupler 31 configured to couple out a portion of the signal delivered by the amplifier 2 to the antenna 5.

The conversion device 3 is constructed in this embodiment as an I/Q demodulator. It contains two passive mixers 32 and 33, the first signal inputs of which are connected to the output of the directional coupler 31. The frequency- or phase-modulated signal delivered by the phase-locked loop 6 is supplied to the mixer 32 as a local-oscillator signal. For this purpose, the local-oscillator input of the passive mixer 32 is connected to a node 40 between input 21 of the amplifier 2 and output 61 of the phase-locked loop 6. The local-oscillator input of the second passive mixer 33 is connected to a phase shifter 34. The latter is also connected to the node 40 at its input. It delays the frequency- or phase-modulated signal by a phase offset of 90°. This can be done, for example, by varying the length in the lines or by varying the delay. However, this must take into consideration the frequency of the frequency-modulated carrier signal. The outputs of the two passive mixers 32 and 33 are connected to connections 35 and 36, respectively.

Instead of the phase shifter 34 shown, other elements are also possible which generate a signal with the same frequency as the signal supplied at the local-oscillator signal and provide two components which are phase shifted with respect to one another. For example, a frequency doubler may be used which is connected to the local-oscillator input. In turn, this is followed by a frequency divider, for example in the form of a master-slave flip-flop. This would make it possible to generate in a simple manner two signals which have the local-oscillator frequency and a phase offset of 90° with respect to one another.

By using the previously frequency-modulated carrier signal as a local-oscillator signal, the frequency modulation and, particularly, the distortions occurring before the amplifier, are taken into consideration in the demodulation of the signal portion fed back. The converted signal with the components I' and Q', provided at the connections 35 and 36, thus only contains the distortions caused by the power amplifier 2. These can then be processed further in order to perform, for example, a predistortion of the components I(k) and Q(k) supplied to the transmitting path and the polar transmitter 1.

Figure 2:
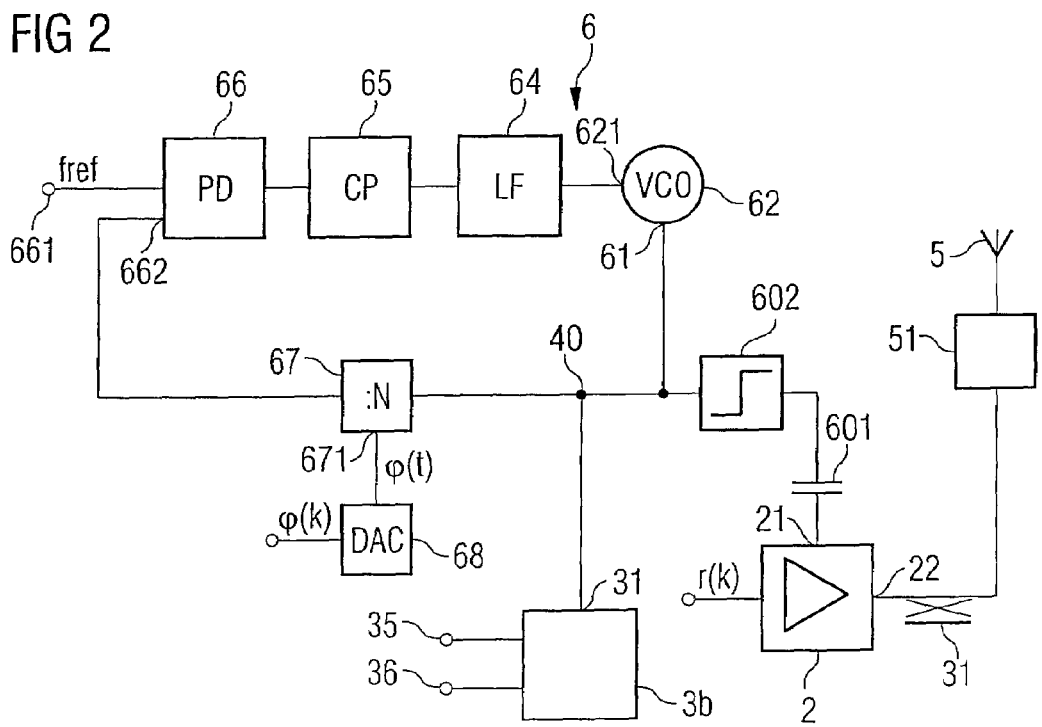
FIG. 2 is a block diagram illustrating another embodiment of the invention.

FIG. 2 shows an embodiment of the invention with an exemplary design for the phase-locked loop 6. Operationally and functionally identical components carry the same reference symbols.

The phase-locked loop 6 contains a forward path with a phase detector 66, a charge pump 65 connected thereto, a loop filter 64, and with a voltage-controlled oscillator 62. The control input 621 for receiving an adjustment signal to the voltage-controlled oscillator 62 is connected to the output of the loop filter 64. The phase detector 66 is supplied with a reference signal with the frequency fref at a reference input 661. In addition, it receives a feedback input 662. The phase detector 66 compares the phases of the signals present at the reference input 661 and at the feedback input 662 and generates from these a correcting or adjustment signal for adjusting the voltage-controlled oscillator 62.

The output 61 of the voltage-controlled oscillator 62 at the same time also forms the output of the phase-locked loop 6. It is connected to the feedback input in which a frequency divider 67 with an adjustable divider ratio is arranged. This frequency divider 67 can be supplied with a continuous-time frequency adjustment word φ(t) which is derived from the frequency adjustment word φ(k). For this purpose, an adjustment input 671 of the frequency divider 67 is coupled to a digital/analog converter 68. The digital-analog converter 68 is supplied with the frequency modulation word φ(k). From this, the former generates a continuous-time adjustment word for adjusting the divider ratio of the frequency divider. Changing the adjustment ratio changes the output frequency of the voltage-controlled oscillator and thus produces a frequency modulation of the output signal.

In the embodiment shown here, the frequency modulation word is only supplied to the frequency divider. In one embodiment, the phase-locked loop is designed with a two-point modulator. In this arrangement, the frequency adjustment word is conditioned, supplied to the frequency divider 67 for adjusting its divider ratio, on the one hand, and, on the other hand, also applied to the voltage-controlled oscillator 62. The two-point modulator makes it possible to achieve a much faster frequency modulation.

The output 61 of the voltage-controlled oscillator 62 is connected to a limiting amplifier 602. This is coupled to the signal input 21 of the power amplifier 2 via a capacitor 601. The capacitor 601 is used for suppressing DC signal components and thus acts as a high-pass filter. Furthermore, the node 40 for supplying the local-oscillator signal to the demodulator device 3 is provided between the frequency divider 67 and the limiting amplifier 602. Accordingly, a signal having a constant envelope is used as the local-oscillator signal. This does not contain any additional amplitude information. As shown in FIG. 2, the signal delivered by the voltage-controlled oscillator 62 can be used directly. In an alternative embodiment, the input 31 of the demodulator device 3 is coupled to a node which follows the limiting amplifier 602. The local-oscillator signal supplied then resembles a pulse-shaped clock signal.

The transmitting arrangement according to the invention can be used for correcting distortions in the amplitude and in the phase of the signal delivered by the power amplifier. Since the power amplifier in modern communication devices with a polar transmitter is frequently operated in a nonlinear range of its characteristic, predistortion units are provided in the transmitting paths. These are supplied with predistortion coefficients by means of which the information to be transmitted is distorted. The predistorted signal is then amplified in the power amplifier and the nonlinear transfer characteristic is corrected as a result.

Figure 3:
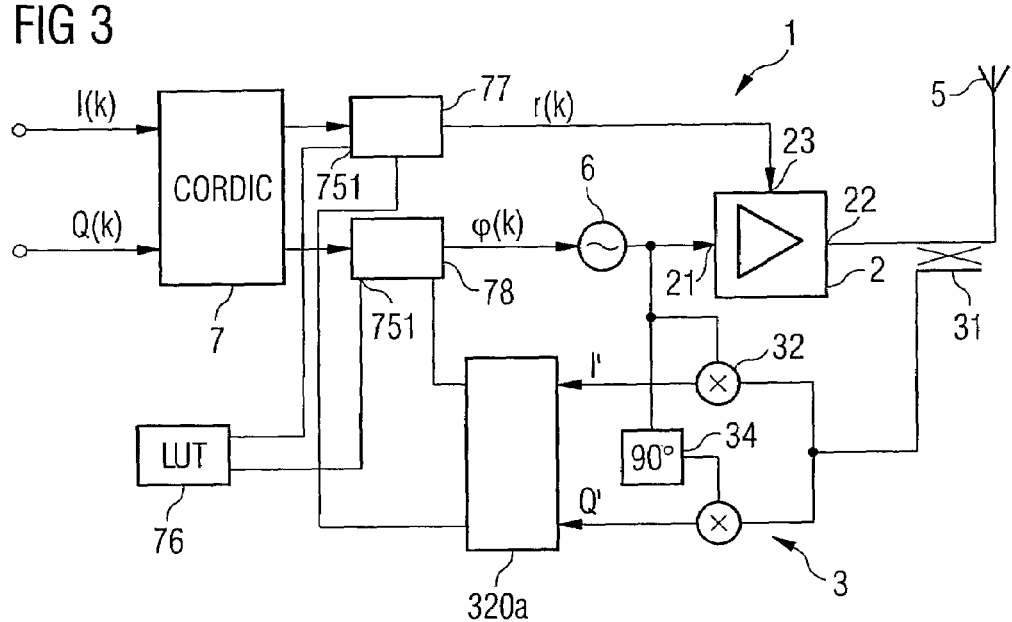
FIG. 3 is a block diagram illustrating another embodiment of a transmitting path.

FIG. 3 shows an embodiment of a transmitting arrangement with predistortion units 77 and 78 which in each case follow one of the two outputs of the converting device 7.

The distortion units 77, 78 in each case have a control input 751 which are connected to a memory 76. In the memory, predistortion coefficients for different operating modes of the transmitting path and of the polar transmitter are stored in various tables. A table is selected based on the operating mode set and the coefficients are transferred into the predistortion units 77 and 78. Following this, they are selected based on the amplitude modulation word r(k) and phase modulation word φ(k) supplied and a predistortion is performed. At present, predistortion is performed in both units 77 and 78, taken into consideration the amplitude modulation word r(k) since this is of special significance for the distortion in the amplifier 2.

The predistortion units and the table with coefficients in the memory 76 take into consideration a static transfer characteristic of the power amplifier 2. In addition, temperature fluctuations can also be taken into consideration with a suitable selection of the different tables in the memory 76. The distortion devices 77 and 78 are also provided for correcting other distortions which cannot be predicted in advance, for example due to a change in the standing wave ratio at the antenna 5.

The device 77 is configured to distort the amplitude modulation word r(k) based on an error signal determined by the demodulation device 3. The distortion unit 78 also operates in similar manner. It changes the phase modulation word delivered by the converting device 7 in response to the error signal determined by the demodulation device 3.

To determine the error, the demodulation device 3 is followed by a computer unit 320a. The computer unit 320a calculates the error component from the two components converted by the demodulation device 3. The error is determined from the residual distortions and can be obtained, for example, by comparison with the signal components to be transmitted. At the same time, the computer unit 320a converts the converted components I' and Q' present in cartesian form into an amplitude component, not shown here, and a phase component. From these, and thus from the error, the computer unit 320a determines coefficients necessary for correcting the error and supplies them to the two distortion devices 78 and 77.

Figure 4:
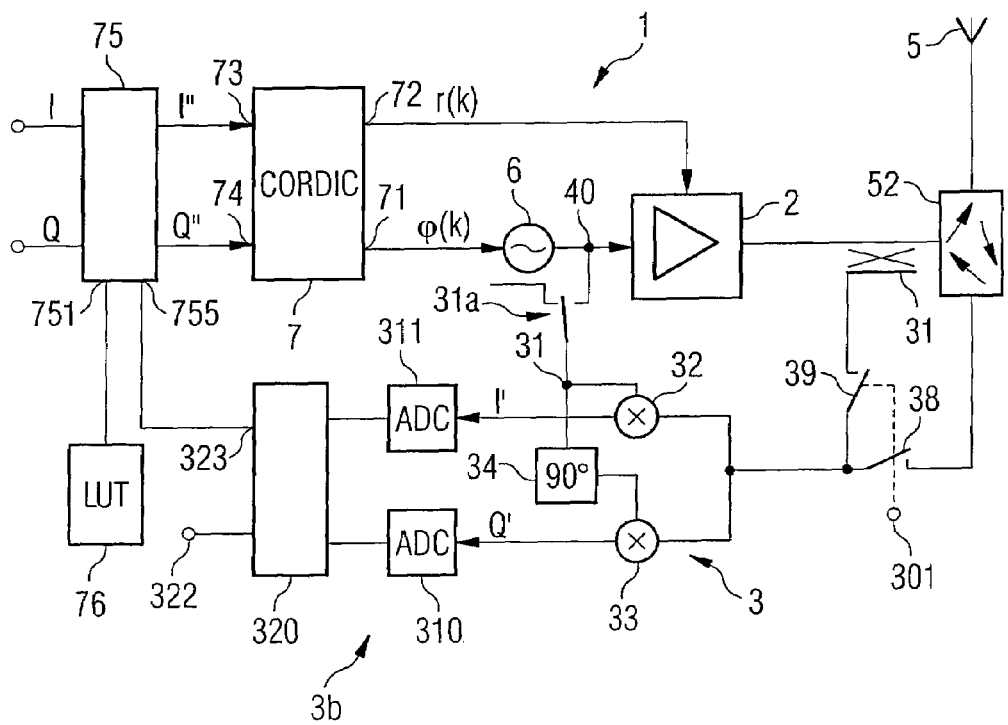
FIG. 4 is a block diagram illustrating another embodiment of a transceiver according to the invention.
Figure 5:
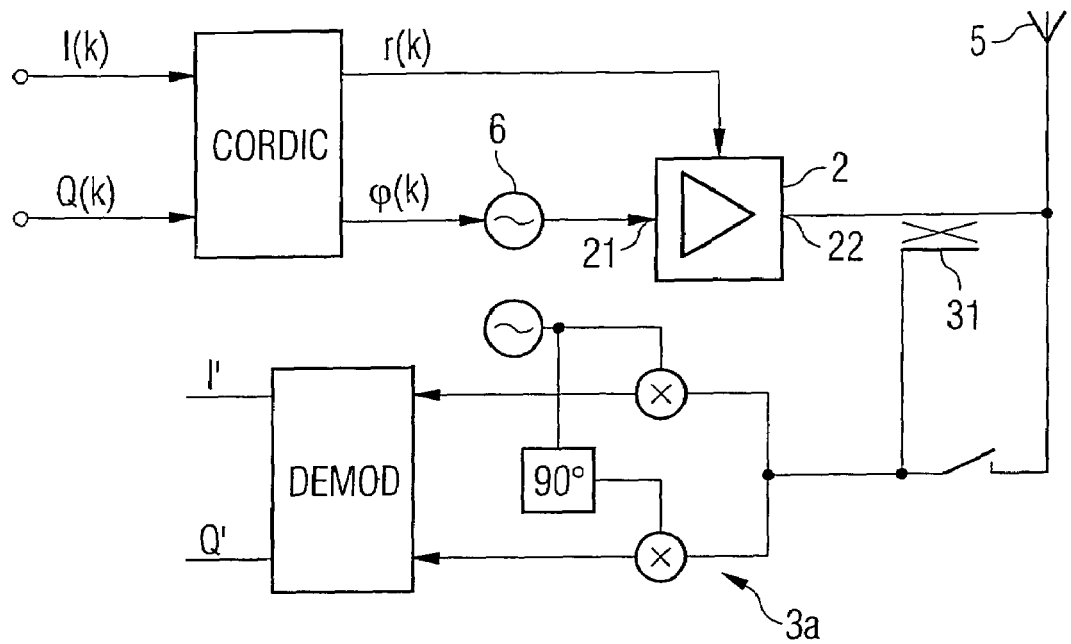
FIG. 5 is a block diagram illustrating a prior art transceiver.

FIG. 4 shows a further embodiment of the invention in the form of a transceiver with a transmitting path and a receiving path.

The transmitting path is designed as polar transmitter and connected to the antenna 5 via a circulator 52. The circulator 52 prevents crosstalk of a transmit signal component into the receiving path. In the receiving path, two switches 38 and 39 are provided at the input end which are closed or open, respectively, via a control signal at a control input 301. They are used for coupling the receiving path to the antenna 5 for demodulating signals received via the antenna during a first operating mode.

In a second operating mode, the receiving path is provided for demodulating and determining the distortions of the power amplifier 2 for correction of the nonlinear characteristic of the power amplifier 2 in the polar transmitter of the transmitting path. The receiving path is connected to the directional coupler 31 via the switch 39. In addition, the demodulation device 3 of the receiving path is connected with its local-oscillator input to a switch 31a. This switches the local-oscillator input of the demodulator arrangement 3 to the node 40 or, respectively, to another local oscillator with a constant-frequency local-oscillator signal based on the operating mode.

In addition, the receiving path has two analog/digital converters 310 and 311. These digitize the converted components I' and Q' and supply them to the demodulation unit 320. In a receive mode of operation of the transceiver, in which the receiving path is coupled to the antenna 5, the demodulation device generates a data sequence according to a selected mobile radio standard and outputs it at its output 322. In a second operating mode in which the receiving path is connected to the directional coupler 31 via the switch 39, the conversion device 3 is supplied with the frequency-modulated carrier signal via the node 40 and into the switch 31a. The demodulation arrangement 320 in the receiving path then determines coefficients from the converted components I' and Q' which represent the error signal caused by the distortion of the power amplifier. These are supplied to a predistortion unit 75 at the control input 755 via a second output 323. The predistortion unit 75 precedes the converting device 7 for converting the in-phase component I and the quadrature component Q into the amplitude modulation word r(k) and the phase modulation word φ(k). For this purpose, it is connected to the memory 76 for supplying the predistortion coefficients via the control input 751. Using the additional coefficients generated by the device 320, the distortions not taken into consideration by the predistortion coefficients in the memory 76 are corrected.

Apart from the embodiments shown here, with a predistortion unit 75 preceding the converting device 7, it is also possible to provide a memory with different tables with predistortion coefficients and to connect these to a distortion unit for correcting the amplitude modulation word and the phase modulation word. The predistortion unit would then follow the converting device 7. In the case where the information to be transmitted is already present in a phase or amplitude modulation word, no additional converting device is necessary.

The invention claimed is:

1. A transmitting arrangement, comprising:
   a first signal input configured to receive a frequency modulation signal;
   a second signal input configured to receive an amplitude modulation signal;
   a phase-locked loop comprising an output and a correcting input which is coupled to the first signal input;
   an amplifying device comprising a control connection coupled to the second signal input, a signal input connected to the output of the phase-locked loop, and an amplifier output;
   a feedback path connected to the output of the amplifying device, and configured to feed back a portion of a signal output by the amplifying device; and
   a conversion device in the feedback path comprising a local-oscillator input, and configured to split a signal present at an input thereof into a first component and a second component by using a signal at the local-oscillator input, wherein the local-oscillator input is coupled to the output of the phase-locked loop.

2. The transmitting arrangement of claim 1, wherein the amplifying device is configured to modulate a supply voltage associated therewith in response to a signal supplied at the control connection.

3. The transmitting arrangement of claim 1, further comprising a limiting amplifier coupled between the output of the phase-locked loop and the signal input of the amplifying device.

4. The transmitting arrangement of claim 1, wherein the phase-locked loop further comprises, in a feedback path thereof, a frequency divider comprising an adjustable divider ratio and a control input that forms the correcting input of the phase-locked loop.

5. The transmitting arrangement of claim 1, further comprising a converting device configured to generate the frequency-modulation signal and the amplitude modulation signal from an in-phase component and a quadrature component.

6. The transmitting arrangement of claim 1, further comprising a directional coupler configured to couple out the portion of the signal delivered by the amplifying device, wherein the directional coupler is provided in the feedback path and is coupled at an output end thereof to the converting device.

7. The transmitting arrangement of claim 6, wherein the directional coupler comprises an attenuating element configured to provide signal level attenuation of the coupled out signal.

8. The transmitting arrangement of claim 1, further comprising:
   a computing unit coupled to an output of the conversion device and configured to determine at least one coefficient from the signal at the output of the conversion device; and
   a distortion unit coupled to the computing unit and to at least one of the first and second signal inputs, wherein the distortion unit is configured to change a signal supplied at an input thereof in response to the at least one coefficient.

9. The transmitting arrangement of claim 1, further comprising a predistortion unit coupled to the first and second signal inputs and configured to distorting a signal input thereto based on coefficients stored in a memory device associated therewith.

10. The transmitting arrangement of claim 1, wherein the conversion device comprises at least one passive frequency mixer comprising a local-oscillator output coupled to the local-oscillator input of the conversion device.

11. The transmitting arrangement of claim 1, wherein the conversion device comprises a phase shifter comprising an input that forms the local-oscillator input, and configured to generate a signal delayed by a phase of 90° from a signal supplied thereto.

12. The transmitting arrangement of claim 1, wherein the conversion device is configured to generate a first and a second signal derived from the signal supplied at the local-oscillator input, wherein the first and second signal have the same frequency as the signal supplied at the local-oscillator input and the first signal has a phase offset of 90° with respect to the second signal.

13. A transmitting arrangement, comprising:
   a first signal input configured to receive a frequency modulation signal;
   a second signal input configured to receive an amplitude modulation signal;
   a polar transmitter comprising inputs connected to the first and the second signal inputs, respectively, and an output, and configured to generate a frequency-modulated signal and then perform amplitude modulation to provide an amplitude and frequency-modulated signal at an output thereof;
   an output coupling unit connected to the output of the polar transmitter; and
   a demodulation device comprising a local-oscillator input, wherein the demodulation device is connected to the output coupling unit and is configured to convert a signal supplied thereto from the coupling unit into a first and a second component with the aid of a frequency-modulated local-oscillator signal at the local-oscillator input, wherein the frequency-modulated local-oscillator signal is derived from the frequency-modulated signal of the polar transmitter.

14. The transmitting arrangement of claim 13, wherein the polar transmitter comprises a phase-locked loop and an amplifier device following the phase-locked loop, wherein a gain of the amplifier device is adjustable by the amplitude modulation signal.

15. The transmitting arrangement of claim 13, further comprising a distortion unit connected to the polar modulator, wherein the distortion unit is configured to change a signal associated with the polar modulator supplied at the input end thereof in response to a coefficient derived from the first and the second component of the demodulation device.

16. The transmitting arrangement of claim 13, further comprising a receiving path configured to receive and demodulate signals, and comprising a conversion device comprising a local-oscillator input coupled to the output of the phase-locked loop of the transmitting arrangement.

17. A method for signal processing, comprising:
   providing a frequency-modulation signal and an amplitude-modulation signal;
   generating a phase-modulated carrier signal in response to the frequency-modulation signal;
   amplifying the phase-modulated carrier signal in response to the amplitude modulation signal;
   coupling out a portion of the amplified carrier signal; and
   frequency-converting the portion coupled out of the amplified carrier signal with a local-oscillator signal derived from the phase-modulated carrier signal.

18. The method of claim 17, further comprising:
   determining a distortion from the frequency-converted portion;

determining at least one predistortion coefficient from the distortion; and distorting the frequency-modulation signal or the amplitude-modulation signal, or both, with the at least one predistortion coefficient, thereby correcting the determined distortion.

19. The method of claim 17, further comprising using the phase-modulated carrier signal as a local-oscillator signal in the step of frequency-converting.

* * * * *